(12) United States Patent
Beck

(10) Patent No.: US 8,729,444 B2
(45) Date of Patent: May 20, 2014

(54) PHOTOVOLTAIC SYSTEM WITH POTENTIAL REDUCTION

(75) Inventor: Bernhard Beck, Volkach OT Dimbach (DE)

(73) Assignee: Adensis GmbH, Dresden (DE)

(*) Notice: Subject to any disclaimer, the term of this patent is extended or adjusted under 35 U.S.C. 154(b) by 494 days.

(21) Appl. No.: 13/049,592

(22) Filed: Mar. 16, 2011

(65) Prior Publication Data

US 2011/0234004 A1 Sep. 29, 2011

(30) Foreign Application Priority Data

Mar. 23, 2010 (DE) .......... 10 2010 012 294

(51) Int. Cl.
*C12Q 1/68* (2006.01)
*H01J 40/00* (2006.01)

(52) U.S. Cl.
USPC .............................. 250/200; 361/88; 136/244

(58) Field of Classification Search
USPC .......... 361/81, 84, 88; 136/244, 293; 250/200
See application file for complete search history.

(56) References Cited

U.S. PATENT DOCUMENTS

| | | | |
|---|---|---|---|
| 2001/0023703 A1* | 9/2001 | Kondo et al. | 136/244 |
| 2009/0034304 A1* | 2/2009 | Engel et al. | 363/71 |
| 2009/0101191 A1 | 4/2009 | Beck et al. | |
| 2009/0279221 A1* | 11/2009 | Coloma Calahorra et al. | 361/84 |

FOREIGN PATENT DOCUMENTS

| | | |
|---|---|---|
| DE | 20 2006 008 936 U1 | 9/2006 |
| EP | 2 086 020 A2 | 8/2009 |

* cited by examiner

*Primary Examiner* — Francis M Legasse, Jr.
(74) *Attorney, Agent, or Firm* — Muncy, Geissler, Olds & Lowe, P.C.

(57) ABSTRACT

A photovoltaic system comprises a plurality of photovoltaic modules which are electrically connected to a string or to multiple parallel-connected strings and form a PV generator. The first string end forms the negative pole of the photovoltaic generator, and the second string end forms the positive pole. A voltage reduction device is provided with the aid of which the potential of the negative pole is lowered to ground. Advantages with regard to the insulation class of the connecting cable used are also provided.

9 Claims, 4 Drawing Sheets

PHOTOVOLTAIC SYSTEM WITH POTENTIAL REDUCTION

This nonprovisional application claims priority under 35 U.S.C. §119(a) to German Patent Application No. DE 10 2010 012 294.7, which was filed in Germany on Mar. 23, 2010, and which is herein incorporated by reference.

BACKGROUND OF THE INVENTION

1. Field of the Invention

The present invention relates to a photovoltaic system comprising a plurality of photovoltaic modules which are electrically connected to a photovoltaic generator whose first string end forms a negative pole and whose second string end forms a positive pole. The photovoltaic generator includes a plurality of photovoltaic modules which are connected to form at least one string. Multiple parallel-connected strings may also be provided.

2. Description of the Background Art

Systems of this type are all too common. In systems of this type, a number of photovoltaic modules, for example ten, are connected in series. The modules form a so-called string. Each photovoltaic module, in turn, includes, for example, 100 photovoltaic cells, which, for their part, are electrically connected in series. An individual semiconductor photovoltaic cell in common use today generates a voltage of approximately 0.5 volts when irradiated by solar energy, which generates a module voltage of 50 volts. When the strand is under load, a voltage of approximately 500 volts results, hereinafter referred to as the string voltage, depending on the system use. When operated without load, the string voltage increases to approximately 800 volts. It is common to combine a plurality of strings, e.g. 10 strings, by means of parallel connection, and then to provide the generated energy for further use with the aid of a common collecting line.

The generated electrical energy is present in the form of direct voltage. It is converted to alternating voltage with the aid of an inverter. The circuits illustrated by way of example in FIGS. 2 and 3 are currently common. The same components are provided with the same reference numerals in each case.

According to FIG. 1, a photovoltaic system 1 comprises a plurality of photovoltaic elements 3, which are connected in series and form two strings 5, which are parallel-connected to each other. Photovoltaic generator 6 formed in this manner has a first and a second string end 7, 9, which have negative potential P1 and positive potential P2, respectively. First string end 7 is the negative pole of photovoltaic generator 6 and thus has first (lower) string potential P1, and second string end 9 is the positive pole of photovoltaic generator 6 and thus has second (higher) string potential P2. An inverter 11 is connected to string ends 7, 9. Voltage Uo between string ends 7, 9 currently amounts to the approximately 500 V mentioned above under load and to the 800 volts mentioned above when operated without load. The insulation of the cables laid to the photovoltaic modules is designed for a value of approximately 1,000 volts, which is sufficient to safely operate the module types of this variant in common use today.

In the interest of simple representation, second circuit 1 illustrated in FIG. 2 includes only one string 5 of series-connected modules 3 in photovoltaic generator 6. This photovoltaic system 1 brings a disadvantage into play. In the illustrated so-called floating operation of photovoltaic system 1, approximately the same amount of voltage is connected to ground 13 at each of the two string ends 7, 9. Positive string potential P2 when operated without load (Uo=800V) is approximately +400 volts to ground 13, based on the example, and negative string potential P1 is approximately −400 volts to ground 13. These voltages to ground 13 occur despite the floating operation, due to a relatively small and negligible conductance (reciprocal value of the ohmic resistance) of the comparatively long connecting lines between modules 3 (wiring of system 1) and the supply lines to inverter 11. In an equivalent circuit diagram representation, the low conductance is symbolized by a resistance 14, which leads to ground 13 approximately in the center of series connection 5 of modules 3. As a result, parasitic discharges to ground 13 ultimately assume great dimensions, and the aforementioned potential distribution +400V, −400V to ground 13 arises in operation without load, since this is the most favorable distribution in terms of energy for overall system 1. Once again, no problems arise in the case of common cabling having an insulation safety value of 1,000 volts.

The provision of a constant voltage source which raises the negative pole of the photovoltaic system to a positive potential is known from DE 20 2006 008 936 U. This opposite procedure is carried out for entirely different purposes: The discharge of electrons from the TCO layer of module 3 is reduced so that cathode discharges are lowered or avoided entirely in order to prevent cathode erosion at the module.

The same measure is known from EP 2 086 020 A2, which corresponds to U.S. Publication No. 20090101191, and which is incorporated herein by reference. In the device for raising potential described therein, a further variant is provided, according to which the constant voltage source is connected at the positive pole of the photovoltaic system in order to raise this voltage to a higher potential for the purpose of reducing a danger of a lightning strike. Note that neither document addresses the lowering of potential, and such an approach would work against the desired objectives described therein.

The field of photovoltaics is currently undergoing technological changes which are aimed at more powerful modules having a higher output voltage than the aforementioned 50 volts for the on-load voltage (500 volts over the string of 10 modules) and 80 volts for the off-load voltage (800 volts for the string off-load voltage). Along with the developments on the inverter side is the ability to process these higher voltages. This is also based on the circumstance that higher voltages at the same power go hand in hand with lower currents, which is a positive trend where the cable cross sections are concerned. Existing cables in an existing photovoltaic system could therefore continue to be used, even after replacing old, i.e. obsolete, modules with new, modern modules, if the insulation requirements are still met.

SUMMARY OF THE INVENTION

It is therefore an object of the present invention to improve the insulation of a cable connection and that of the photovoltaic modules in a photovoltaic system in such a way that the highest possible voltage may be generated at the photovoltaic generator without exceeding the permissible dielectric strength of the cable.

This object is achieved according to an embodiment of the invention by a device for reducing the voltage, with the aid of which the potential of the negative pole may be lowered to ground.

This measure has the advantage that, in newly designed systems having an off-load voltage of over 1,000 volts to a maximum of 2,000 volts, it is possible to continue using economical cables whose insulation is designed for only 1,000 volts. The insulation value of a cable as well as that of a photovoltaic module is always indicated in dielectric strength to ground. This means that a module or cable having a maximum insulation resistance can be operated only within this maximum range.

The present invention offers the advantage that, even if progress in the manufacture of electronic inverters allows the number of series-connected modules to be increased, which results in higher on-load and off-load voltages, the reduction in potential according to the invention does not result in greater expense on the cable side, as long as a 1,000-volt off-load voltage is not exceeded in the operating mode according to FIG. 1 and a 2,000-volt off-load voltage is not exceeded in the operating mode according to FIG. 2.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
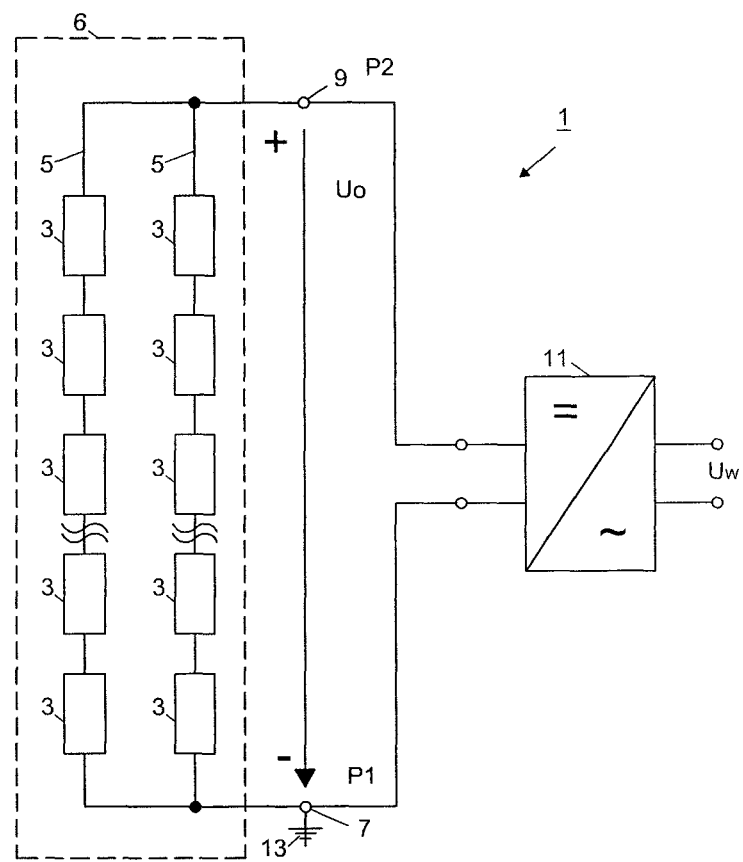
FIG. 1 shows a diagram of a non-floating photovoltaic system according to the conventional art.

The same reference numerals are used for the same components. As mentioned above, FIGS. 1 and 2 show diagrams of a non-floating photovoltaic system and a floating photovoltaic system (PV system) 1, respectively. This was briefly discussed in the introductory section. PV system 1 comprises a plurality of photovoltaic modules 3, hereinafter referred to in short as modules, which are series-connected to each other. Modules 3 together form a string 5, which has a first string end 7 for electrical purposes which represents the negative pole of PV generator 6, and at which a negative string potential P1 is present. Multiple strings 5 may be connected in parallel. String 7 has a second string end 9 at which a positive string potential P2 is present. The voltage present between string ends 7, 9 is identified by Uo. A floating inverter 11, which converts the direct current supplied by modules 3 to alternating current and makes it available, for example, for feeding into a supply network (not illustrated), is present at string ends 7, 9. The term "floating" in this case means that inverter 11 is ground potential-free, i.e., not connected to ground 13. It therefore has neither a positive nor a negative connection to ground 13.

According to FIG. 1, photovoltaic system 1 is operated in a non-floating manner, i.e., negative string potential P1 at first string end 7 is applied to ground potential 13. Positive string potential P2 is then equal to voltage Uo, which is present via strings 5, and corresponds, for example, to 800 volts when operated without load. Photovoltaic system 1 illustrated in FIG. 2, on the other hand, shows the floating operation of a photovoltaic system 1. Approximately the same voltage is present at each of the two string ends 7, 9. Positive string potential P2 is approximately +400 volts to ground 13, based on the example, and negative string potential P1 is approximately −400 volts to ground 13. In the system having floating potential according to FIG. 2, raising the generator voltage, for example, to 1,500 volts, runs the risk that the maximum permissible voltage of 1,000 volts between ground and the component in question is exceeded by 500 volts, for example due to a fault to ground on the positive or negative line.

Figure 2:
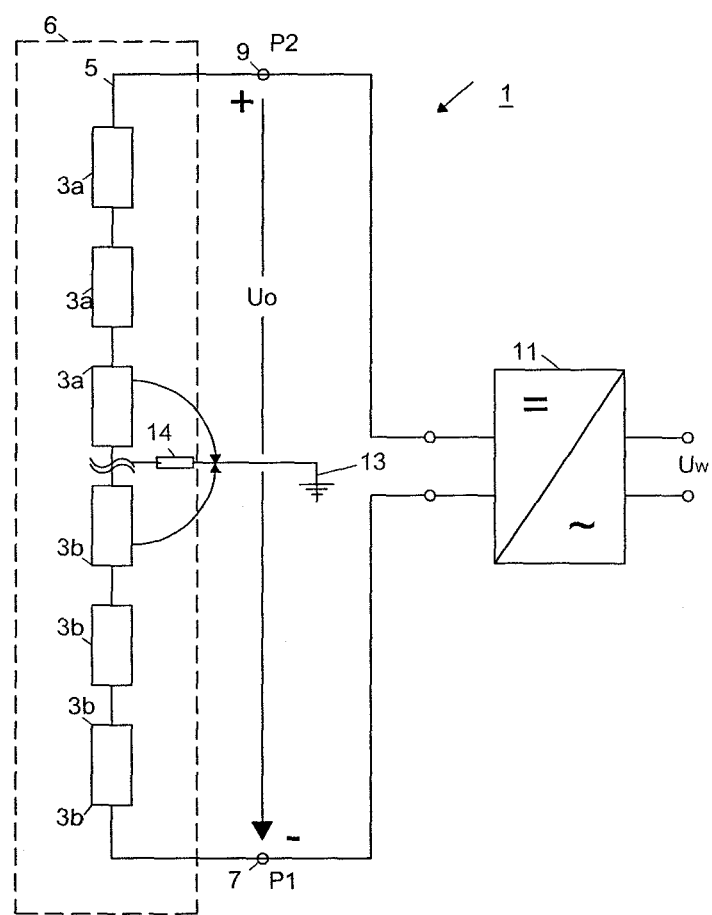
FIG. 2 shows a diagram of a floating photovoltaic system according to the conventional art.
Figure 3:
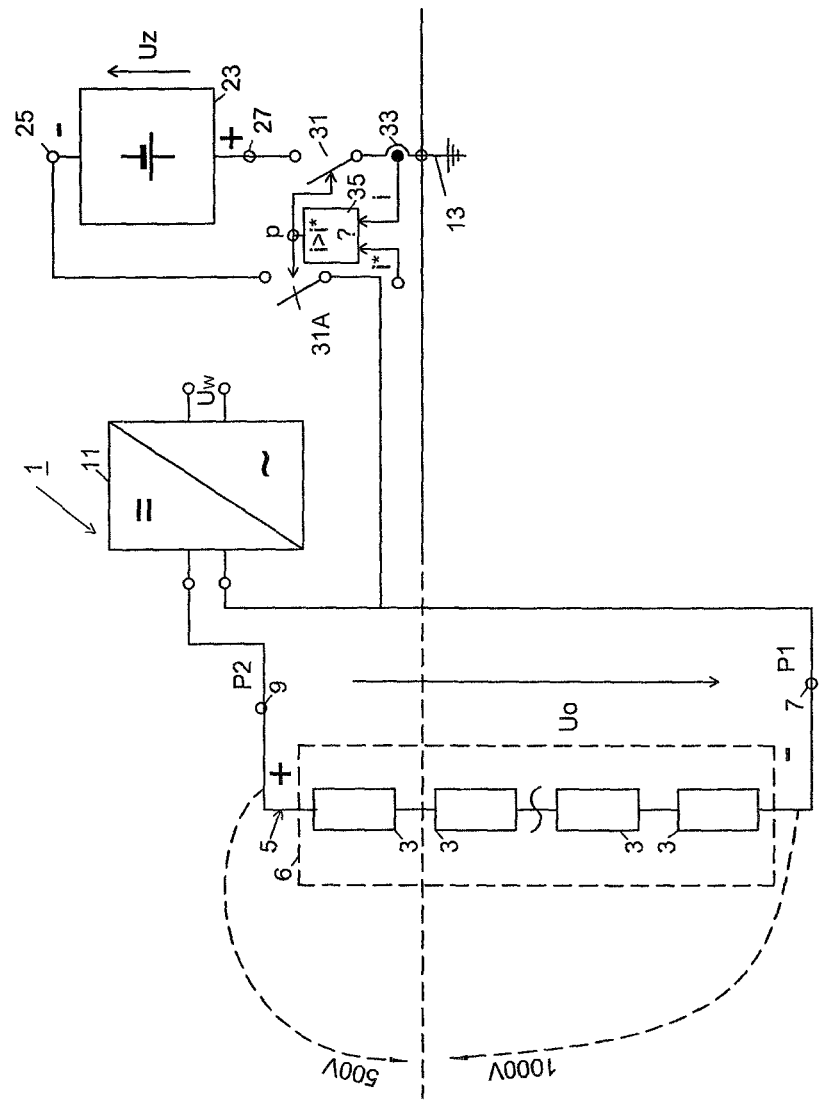
FIG. 3 shows a diagram of a higher-power photovoltaic system with reduced potential.

FIG. 3 shows the system in FIG. 2, including modern photovoltaic modules which each have an off-load voltage of 150 volts. The number of modules 3 in each string 5 is also increased to ten, which results in an off-load voltage of 1,500 volts at an on-load voltage of 1,000 volts. A system of this type could not be operated with the aid of the currently used cables, which have an insulation resistance of 1,000 volts, nor should the modules which are approved for a dielectric strength of 1,000 volts be installed. In a newly configured system, therefore, more expensive cables would have to be used, or refitting an existing system with modern modules would be impossible, should such a measure be planned.

The invention remedies this situation by the fact that, as shown in FIG. 3, in addition to components and elements 3 through 13 described above, a constant direct current source 23 is provided which, in the exemplary embodiment, supplies a voltage of, for example, Uz=1,000 volts, and which has a positive connecting pole 27 and a negative connecting pole 25. The fact that voltage source 23 is a constant voltage source having a predefined voltage (Uz) provides the advantage that, due to the theoretically infinitely high internal resistance of the voltage source, the characteristic of the floating variant is maintained.

Positive connecting pole 27 is applied to ground potential, whereby potential P1 at first, negative string voltage end 7 is fixed at −1,000 volts, and positive string potential P2 is free floating. Or, in other words, negative string potential P1 at first string end 7 is biased to −1,000 volts. If voltage Uz of 1,500 volts present via string 5 is deducted from these −1,000 volts, the result is a string potential P2 at second, positive string end 9 of plus 500 volts when operated without load and of zero volts when operated under load. These values are below the critical insulation resistance of the PV system cables in current use, making it possible to substantially increase the power transmission of photovoltaic generator 6 when using economical cables.

Photovoltaic modules of an unmodified design with regard to dielectric strength may also be used.

Figure 4B:
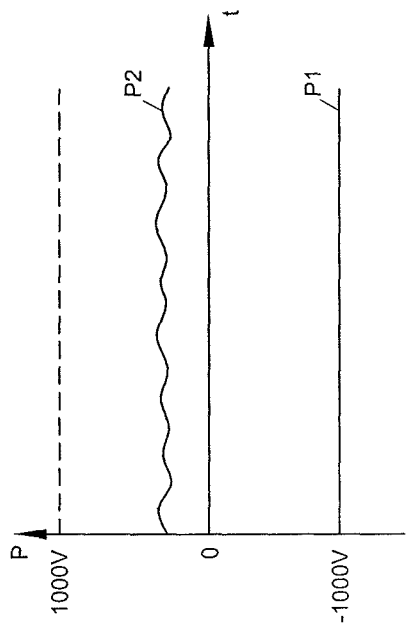
FIG. 4b shows a voltage curve with potential reduction.
Figure 4A:
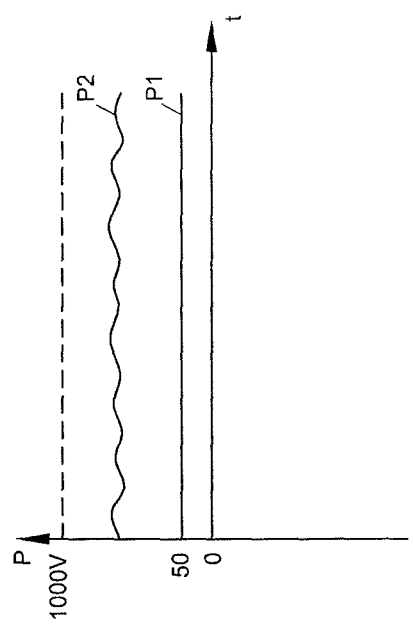
FIG. 4a shows a voltage curve according to the conventional art.

In FIG. 4a, potential P(t) of photovoltaic generator 6 is plotted over time, as is the case according to the prior art described in DE 20 2006 008 936 U. A constant voltage source which is grounded by its negative pole raises negative potential P1 of photovoltaic generator 6 to 50 volts, from where the on-load and off-load voltages may float up freely. If PV generator 6 according to FIG. 3 were to be used in this case, the result would be an off-load voltage U (P2−P1) of 1,550 volts (50 volts bias+1,500 volts off-load voltage) to ground, which would place excessive demands on the insulation of the cables currently in common use and which would be impermissible.

The curve according to FIG. 4b, in which constant voltage source 23 is operated by its grounded positive pole, shows a different approach. First, negative string end 7 is fixed at the value of the potential of voltage source 23, which is −1,000 volts. A more negative potential is not possible, since positive potential P2 of the PV generator at second string end 9 may only float upward, and is therefore always higher than the negative potential. Even at the maximum possible off-load voltage of 1,500 volts, a maximum potential P2 of 500 volts to ground results. Thus, a safety gap of 500 volts is always present up to the permissible voltage conductance of the cable above the ground potential.

To dimension constant voltage source 23, it is currently practical to aim for a voltage (Uz) between 300 volts and 1,500 volts, in particular between 500 volts and 1,300 volts, within this range, in turn, preferably between 700 volts and 1,100 volts, and finally, based on the cable sets currently installed, between 950 volts and 1,050 volts. The aforementioned voltage ranges are to be viewed with regard to the currently foreseeable technological developments. If PV systems in the medium voltage range of several thousand volts become possible in the future, the advantages of the above potential reduction likewise remains the same if a constant voltage source 23 having a correspondingly high medium voltage is used.

It is self-evident that thin film modules having a TCO layer may not be used with the present voltage reduction, for they would have a highly reduced life cycle due to cathode erosion.

System 1 shown in FIG. 3 also includes personal protection means in the form of a circuit-breaker 31 or an alternative circuit-breaker 31A. This protects a person who touches a part of system 1. Circuit-breaker 31 or 31A is attached in such a way that it disconnects constant voltage source 23 upon reaching a preset current limit value i*. Therefore, no more current i flows through the body of the endangered person thereafter. Current value i* for maximum permissible leakage current i may be, for example, 20 mA. Of course, an alarm signal a may also be issued in addition.

In other words, a circuit-breaker 31—or alternatively, a circuit-breaker 31A—may be used to avoid endangering people. The circuit breaker is used to interrupt the connection between ground 13 and the one pole 27 of direct voltage source 23 at any point. It performs the function of an earth leakage circuit breaker. However, a leakage current circuit breaker of this type is not used at present. Instead, a sensor or current measuring element 33, which measures current i and supplies a corresponding measured value to a comparison element 35, is provided in the line.

A prebound current limit value i* is applied to the comparison element. If current value i exceeds limit value i*, a tripping signal p is issued which results in the tripping of circuit-breaker 31 or 31A. This tripping signal p may be also used at the same time as alarm signal a to indicate the dangerous state of system 1 or the danger to a person.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A photovoltaic system comprising:
    a plurality of photovoltaic modules that are electrically connected to form at least one string and that form a photovoltaic generator whose first string end forms a negative pole and whose second string end forms a positive pole; and
    a device adapted to reduce a voltage to aid lowering of the potential of the negative pole versus ground,
    wherein the device is a voltage source having a negative connecting pole and a positive connecting pole, the positive connecting pole being applied to ground potential and the negative connecting pole being electrically connected to the negative pole of the photovoltaic generator.

2. The photovoltaic system according to claim 1, wherein the voltage source is a constant voltage source having a preset voltage.

3. The photovoltaic system according to claim 1, wherein the first and the second string ends of the photovoltaic generator are connectable to a floating inverter.

4. The photovoltaic system according to claim 1, wherein the alarm signal is forwarded to a warning device which indicates an operating state of the photovoltaic system and/or a degree of danger to people.

5. The photovoltaic system according to claim 1, further comprising a circuit-breaker, which disconnects the voltage source from the photovoltaic system when a current is detected between the photovoltaic generator and ground potential above a preset current limit value or which separates the voltage source from the ground potential.

6. The photovoltaic system according to claim 3, wherein the constant voltage source provides a voltage between 100 volts and 1,500 volts.

7. The photovoltaic system according to claim 2, wherein the constant voltage source provides a voltage between 500 volts and 1,500 volts.

8. The photovoltaic system according to claim 2, wherein the constant voltage source provides a voltage of approximately 1,000 volts, in particular between 950 volts and 1,050 volts.

9. The photovoltaic system according to claim 5, further comprising a comparison circuit for which a current limit value is preset and which is connectable to a current measuring element in a line from or to the voltage source.

* * * * *